(12) United States Patent
Barkley et al.

(10) Patent No.: US 9,025,407 B2
(45) Date of Patent: *May 5, 2015

(54) APPARATUS AND METHODS TO PROVIDE POWER MANAGEMENT FOR MEMORY DEVICES

(71) Applicant: Micron Technology, Inc., Boise, ID (US)

(72) Inventors: Gerald Barkley, Oregon, WI (US); Nicholas Hendrickson, Burnsville, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/457,039

(22) Filed: Aug. 11, 2014

(65) Prior Publication Data

US 2014/0347947 A1   Nov. 27, 2014

Related U.S. Application Data

(63) Continuation of application No. 13/605,538, filed on Sep. 6, 2012, now Pat. No. 8,804,449.

(51) Int. Cl.
  *G11C 5/14*  (2006.01)
(52) U.S. Cl.
  CPC ........................... *G11C 5/14* (2013.01)
(58) Field of Classification Search
  USPC ................................................. 365/226, 207
  See application file for complete search history.

(56) References Cited

U.S. PATENT DOCUMENTS

| 7,307,268 | B2 | 12/2007 | Scheuerlein |
| 8,804,449 | B2 * | 8/2014 | Barkley et al. ................ 365/226 |
| 2002/0136047 | A1 | 9/2002 | Scheuerlein |
| 2004/0073749 | A1 | 4/2004 | Parthasarathy et al. |
| 2010/0257379 | A1 | 10/2010 | Wang et al. |
| 2011/0058424 | A1 | 3/2011 | Goda et al. |
| 2011/0058439 | A1 | 3/2011 | Lee et al. |
| 2012/0113738 | A1 | 5/2012 | Tsern et al. |

OTHER PUBLICATIONS

Korean Intellectual Property Office; International Search Report and Written Opinion of the International Search Authority of Related PCT Application No. PCT/US2013/058323, Filing Date Sep. 5, 2013; Mailing Date of Documents Dec. 18, 2013; Daejeon Metropolitan City, Republic of Korea.
USPTO; Office Action dated Dec. 20, 2013, from related U.S. Appl. No. 13/605,538, filed Sep. 6, 2012.

* cited by examiner

*Primary Examiner* — Huan Hoang
(74) *Attorney, Agent, or Firm* — Knobbe Martens Olson & Bear LLP

(57) ABSTRACT

An apparatus, such as a nonvolatile solid-state memory device, may, in some implementations, include access line bias circuitry to set a bias level associated with a deselected access line(s) of a memory core in response to mode information. In one approach, access line bias circuitry may use linear down regulation to change a voltage level on deselected access lines of a memory core. A memory access device, such as a host processor, may be provided that is capable of dynamically setting a mode of operation of a memory core of a memory device in order to manage power consumption of the memory. Other apparatuses and methods are also provided.

14 Claims, 4 Drawing Sheets

APPARATUS AND METHODS TO PROVIDE POWER MANAGEMENT FOR MEMORY DEVICES

CROSS-REFERENCE TO RELATED APPLICATION

This application is a continuation application of U.S. application Ser. No. 13/605,538, filed Sep. 6, 2012 (now U.S. Pat. No. 8,804,449), the entirety of which is incorporated by reference herein.

BACKGROUND

1. Field

The disclosed structures and/or techniques relate generally to memory devices and, more particularly, to apparatus and methods for managing power consumption within memory devices.

2. Description of the Related Art

There is a general desire for electronic components to consume relatively low amounts of power to perform their intended function(s). In some applications, this desire may be more pronounced. For example, in electronic devices in which energy may be limited (for example, battery powered devices, etc.), device use time between charges may be extended if components are used that consume less power. Reduced power consumption in an electronic device may also be beneficial in that it may result in less heat generation within the device. In addition, reduction of power consumption within an electronic device may also reduce an amount of electric energy used to perform an application, as well as the associated cost of that energy. Reduction of energy costs may be pronounced in large operations (for example, data centers that typically operate a relatively large number of computing devices and/or storage devices within an area, etc.). Nonvolatile solid-state memory devices, and/or systems that use them, may comprise one example of apparatus that may benefit from a reduction in power consumption.

BRIEF DESCRIPTION OF THE FIGURES

Non-limiting and non-exhaustive implementations will be described with reference to the following figures, wherein like reference numerals refer to like parts throughout the various figures unless otherwise specified.

DETAILED DESCRIPTION

Figure 1:
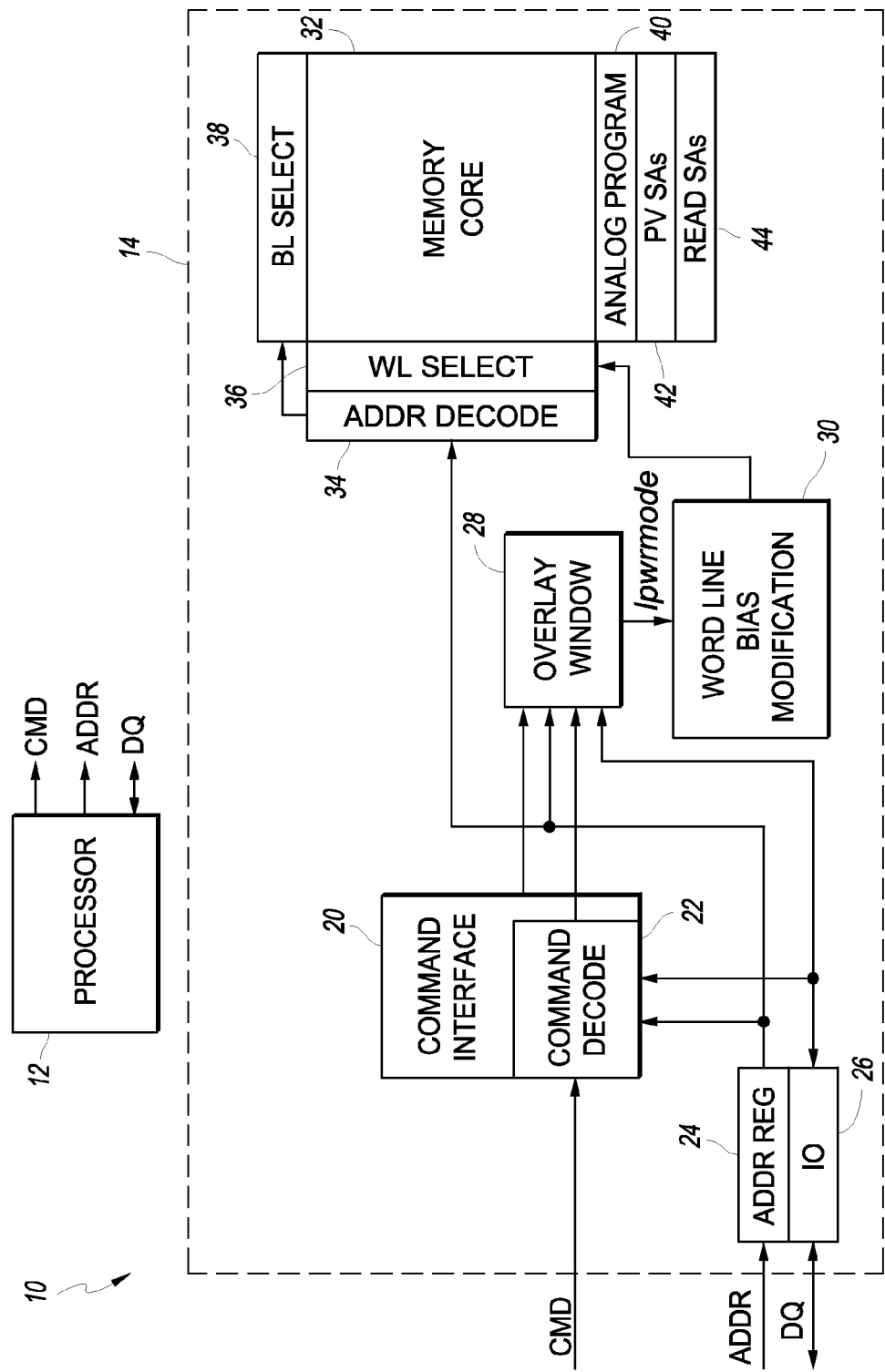
FIG. 1 is a block diagram illustrating a computing system according to an example implementation.

Reference throughout this specification to "one implementation," "an implementation," or "certain implementations" means that a particular feature, structure, or characteristic described in connection with a described implementation(s) may be included in at least one implementation of claimed subject matter. Thus, appearances of the phrase "in one example implementation," "in an example implementation," or "in certain example implementations" in various places throughout this specification are not necessarily all referring to the same implementation(s). Furthermore, particular features, structures, or characteristics may be combined in one or more implementations.

Embodiments of claimed subject matter may include methods and/or apparatus (for example, an individual apparatus or a combination of apparatus or components thereof) for performing operations. An apparatus may be specially constructed for desired purposes and/or an apparatus may comprise a general-purpose computing device capable of operating in accordance with a computer program stored in memory. A program may be stored in memory, such as, but not limited to, any type of disk including floppy disks, optical disks, compact disc read only memories (CD-ROMs), magnetic-optical disks, read-only memories (ROMs), random access memories (RAMs), nonvolatile memories such as electrically programmable read-only memories (EPROMs), electrically erasable and programmable read only memories (EEPROMs) and/or FLASH memories, phase change memories (PCM) and/or any other type of media suitable for storing electronic instructions.

A memory typically may comprise a non-transitory device. In this context, a non-transitory memory may include a device that is tangible, meaning that the device has a concrete physical form, although the device may change one or more of its physical states. Thus, for example, non-transitory refers to a device remaining tangible despite a change in state.

In describing embodiments of claimed subject matter, the term "bit" corresponds to a binary digit of data, such as represented by a state of a binary digital data signal, which is sometimes also referred to as a logic signal, a binary signal, a logic state, or a binary state. The value of a bit, a fraction of a bit, or multiple bits may be stored by programming (for example, writing) a memory cell, such as a single transistor, for example, to one of a plurality of data states. As used herein, plurality means two or more. For example, in a single level memory cell (SLC or SLC cell), the cell might be erased/programmed to a first (for example, logic 1) data state or a second (for example, logic 0) data state. Additionally, multiple binary digital data signals and/or multiple data states comprising individual binary digital data signals and/or data states may be organized and/or aggregated to construct (for example, assemble) a "symbol," which may collectively represent, for example, two bits, four bits, eight bits, 10 bits, and so forth. In one example, a 2-bit symbol may have a binary value of 00, 01, 10, or 11. In some cases, a single memory cell may be selectively programmed to a respective data state representing any one of those values. For example, a 00 value for a 2-bit symbol may be stored by programming a memory cell to a respective one of four possible data states (for example, corresponding to a respective range of threshold voltage levels). In a similar manner, a particular value of a O-bit symbol (for example, 0101) may be stored by programming one or more memory cells to a respective one of 16 possible data states, and a particular value of an 8-bit symbol (for example, 0000 0110) may be stored by programming one or more memory cells to a respective one of 256 different data states, and so forth. Any of the foregoing symbols may be communicated as one or more measurable physical properties (for example, an acoustic, current, radiation, and/or voltage level) of, for example, one or more data signals.

Memory may be employed in a variety of contexts. As an example, memory may be included in a computing system. In this context, the term computing system refers to at least a processor and memory coupled by a bus. Likewise, in this application, the terms memory, memory system, memory module, memory device and/or memory apparatus are used interchangeably unless the context of usage indicates otherwise. A memory cell, however, refers to a unit of storage within a memory and a memory array refers to an array of memory cells. Typically, memory cells of an array comprise a memory core. It will be understood, however, that a memory, memory system, memory module, memory device and/or memory apparatus may also include other circuitry or components to enable use of the memory cells, for example. Likewise, a memory subsystem refers to a sub-portion of a memory system.

In an example implementation, an apparatus in the form of a nonvolatile memory device may communicate with one or more processors or other memory access devices via (for example, through) a plurality of associated interfaces. A nonvolatile memory device may, for example, comprise a single channel memory device or a multi-channel memory device. Two or more of a plurality of interfaces may comprise a substantially similar type or differing types. By way of non-limiting example, in certain implementations, one interface may comprise a parallel interface while another interface may comprise a serial interface. A nonvolatile memory device may, for example, comprise a phase change memory (PCM), charge storage memory (such as that commonly referred to as flash memory), or the like or any combination thereof, though claimed subject matter is not limited to such examples.

It is of course understood that claimed subject matter is not limited in scope to a particular embodiment, implementation, or example which may be provided primarily for purposes of illustration. Rather, a variety of hardware, firmware, or software embodiments, or combinations thereof, are possible (other than software per se) and are intended to be included within the scope of claimed subject matter. Therefore, although aspects of claimed subject matter may be described below with reference to one or more examples or illustrations, it is to be understood that any examples or illustrations so described are intended to be non-limiting with respect to claimed subject matter.

FIG. 1 is a block diagram illustrating an apparatus in the form of a computing system 10 according to an example implementation. As shown, the computing system 10 includes a memory access device, such as a processor 12, and a nonvolatile memory device 14. The processor 12 is able to access the nonvolatile memory 14 to perform, for example, information storage and/or retrieval functions. In some embodiments, the nonvolatile memory 14 may comprise a packaged device having external nodes (for example, contacts, terminals or the like) to be coupled to the processor 12 and/or other memory access devices, such as in an exterior environment. In some implementations, the nonvolatile memory 14 may be implemented in a common interoperable platform-type structure (for example, chip, substrate, or board), such as with the processor 12. Communication between the host processor 12 and the nonvolatile memory 14 may be direct or it may be through or utilize a chipset, direct memory access (DMA) logic, or some other intermediary circuitry or logic.

In some embodiments, the nonvolatile memory 14 may be capable of operating in multiple modes of operation. In addition, the nonvolatile memory 14 may permit a memory access device, such as the host processor 12, to set a mode of operation of the nonvolatile memory 14 (for example, permitting a memory access device to change or maintain a mode of operation). In some embodiments, the nonvolatile memory 14 may have a default mode of operation that may be used in an absence of receiving mode information from the processor 12. In at least one implementation, for example, the nonvolatile memory 14 may be capable of operating in a lower-latency read/write mode or in a lower-power read mode. The nonvolatile memory 14 may be capable of operating in other modes of operation as well. In one embodiment, the lower-latency read/write mode has lower latency for writes than the lower-power read mode, and the lower-power read mode has lower power consumption than the lower-latency read/write mode.

In one embodiment, the nonvolatile memory 14 has two modes of operation: (a) a higher-voltage mode; and (b) a lower-voltage mode. The higher-voltage mode supports both reads and writes, but has higher power consumption, higher leakage currents, and the like, than the lower-voltage mode. The lower-voltage mode of operation supports only read operations, but consumes much less power than the higher-voltage mode. To perform a write operation while in the lower-voltage mode, the nonvolatile memory 14 transitions from the lower-voltage mode to the higher-voltage mode, which results in latency. Accordingly, the higher-voltage mode can be considered to be a lower-latency mode, and the lower-voltage mode can be considered to be a lower-power mode.

During operation of the computing system 10, the processor 12 may read information from and/or write information to the nonvolatile memory 14. In some implementations, the processor 12 may be capable of dynamically setting (for example, modifying) a mode of operation of one or more memory cores (for example, one or more memory arrays) of the nonvolatile memory 14 to manage power consumption within the nonvolatile memory 14, for example. The dynamically set mode is changeable from among two or more operational modes, that is, modes that permit reading and/or writing of data, rather than merely changing mode from a normal operational mode and a non-operational mode, such as a standby mode. The processor 12 may be programmed to evaluate read and/or write activity involving the nonvolatile memory 14 and determine a mode of operation for one or more memory cores of the nonvolatile memory 14 based, at least in part, thereon. For example, if a series of write operations that does not involve a large number of memory write operations on a relative basis may be expected for a memory core of the nonvolatile memory 14, the processor 12 may choose to maintain a memory core in a lower-latency read/write mode or, if in a lower-power read mode, to change to a lower-latency read/write mode. Similarly, if a mix of read and write operations may be expected that does involve a large number of memory write operations on a relative basis, the processor 12 may choose to maintain a memory core in a lower-latency read/write mode or, if in a lower-power read mode, to change to a lower-latency read/write mode. If read operations are predominantly expected with an occasional occurrence of a large number of write operations, for example, the processor 12 may choose to operate the nonvolatile memory 14 in a lower-power read mode to reduce power consumption. Specific details may vary, of course, with a variety of implementation related parameters, such as number of cells, amount of power consumed, amount of latency, etc. In this manner, nonetheless, the processor 12 may be capable of managing, at least to some extent, in a specific implementation, for example, a power/performance tradeoff associated with use of the nonvolatile memory 14. The processor 12 may provide mode information to the nonvolatile memory 14 that identifies a mode of operation for the nonvolatile memory 14, such as may be driven by the processor 12, for example. In at least one embodiment, the processor 12 may be housed within a package that includes one or more nodes to be coupled to the nonvolatile memory 14.

With reference to FIG. 1, the nonvolatile memory 14 may include: a command interface 20 including command decode functionality 22, an address register 24, an input/output register 26, an overlay window 28, access line bias circuitry (for example, word line bias circuitry 30), and a memory core 32. The command interface 20, via a command decode functionality 22 for example, may be operative to receive commands from the processor 12, decode the commands, and perform actions to implement the commands. The command interface 20 and its command decode functionality 22 may be implemented in hardware, software, firmware, or a combination thereof (other than software per se). An address register 24 may be operative to store addresses received from the processor 12 for use during read and/or write operations (referred to collectively herein as "information transfer operations"). An input/output register 26 may store, for example, information to be written into and/or information that has been read from the memory core 32 during information transfer operations.

The overlay window 28 may comprise a memory space that overlays a sub-area of the memory core 32 (for example, it may be mapped into the memory address space) and may allow device commands or state sequences to be entered without necessarily directly writing them to memory. The command interface 20 may include, for example, mode registers that may permit the overlay window 28 to be enabled, for example. The processor 12 may write information to one or more of mode registers of the command interface 20 and may enable the overlay window 28. After the overlay window 28 has been enabled, it may be accessed like another section of the memory core 32, for example. As shown in FIG. 1, the overlay window 28 may be coupled to the address register 24 to receive address information and/or to the input/output register 26 to receive stored state information at identified addresses.

The memory core 32 may include a plurality of memory cells that are operatively accessible via access lines, which commonly may also be referred to as word lines in some implementations. Typically, memory cells within a memory core 32 may be physically arranged in rows and/or columns that correspond to word lines and/or data lines (which may commonly also be referred to as bit lines in some implementations), respectively, but claimed subject matter is not limited to such a physical arrangement. That is, other physical arrangements are possible and are included within the scope of claimed subject matter.

A memory cell of the memory core 32 may be programmed to one of two or more data states, capable of representing, for example, one or more bits of state information. In some implementations, the nonvolatile memory 14 may allow a single memory cell of the memory core 32 to be accessed during an information transfer operation. In other implementations, the nonvolatile memory 14 may permit multiple memory cells, such as those commonly coupled to a single word line of the memory core 32, to be accessed during an information transfer operation. In still other implementations, the nonvolatile memory 14 may permit most or all of memory cells coupled to a word line to be accessed during an information transfer operation. It should be appreciated that claimed subject matter is not limited by a particular fashion in which memory cells may be accessed in a memory core.

In addition to memory cells, access (for example, word) lines and/or data (for example, bit) lines, the memory core 32 may also include: address decode logic 34, word line select circuitry 36, bit line select circuitry 38, analog program circuitry 40, program verify sense amplifiers 42, and/or read sense amplifiers 44, although this is merely one example of a non-limiting embodiment. The address decode logic 34 may decode address information received from the address register 24 to identify particular memory cells that may be subject to an information transfer operation. The address decode logic 34 may provide this information to the word line select circuitry 36 and/or the bit line select circuitry 38 which may be operative for electronically selecting appropriate word lines and/or bit lines, respectively, to provide access to memory cells. The analog program circuitry 40, the program verify sense amplifiers 42, and/or the read sense amplifiers 44 may comprise read and write circuits that may be operative in some implementations for transferring information into addressed memory cells during write operations and/or retrieving information from addressed memory cells during read operations. More specifically, in an example implementation, the analog program circuitry 40 may write information to addressed memory cells during a write operation, the program verify sense amplifiers 42 may verify information written to addressed memory cells during write operations, and/or the read sense amplifiers 44 may be operative for sensing information stored in addressed memory cells during read operations, for example.

In various embodiments, different types of nonvolatile memory technologies may be used for the memory core 32. For example, technologies such as phase change memory, NOR flash memory, NAND flash memory, resistive memory, spin torque memory, and/or combinations thereof may be employed in various embodiments in accordance with claimed subject matter. In at least one implementation, phase change memory (PCM) technology may be used for the memory core 32. In a phase change memory, higher voltages may be employed to write information to memory cells than may be employed to read information from memory cells. For example, write operations may involve a change in state of a phase change material (for example, from a crystalline state to an amorphous state, etc.) in comparison with read operations. Read operations may be performed in these memory devices at lower voltage levels than used for write operations; however, leakage currents may exist within phase change memory devices if higher voltage levels are present on word lines, for example. If so, leakage currents may act to increase power consumption and, therefore, are typically undesirable.

In one possible leakage mechanism during a read operation, for example, leakage current may flow from word line select circuitry, such as through a deselected word line, through bit line select circuitry associated with a deselected bit line crossing the deselected word line (for example, through a reverse biased base-to-emitter junction of a bipolar junction transistor (BJT) selector device, as may be used in PCM memory), through other bit line select circuitry associated with the deselected bit line and a selected word line (for example, through an emitter-to-base junction of a BJT selector device), and through the selected word line to word line select circuitry associated therewith. A similar leakage path may exist for multiple memory cells in a memory core that may be associated with a deselected word line and a deselected bit line, potentially resulting in leakage current and undesirable power consumption. By using a lower voltage on a deselected word line(s) during read operations in a PCM memory, for example, leakage current may be reduced, thus potentially reducing power consumption without significant degradation in performance.

The word line bias circuitry 30 may include circuitry operative for setting (including, but not limited to, for example, maintaining or changing) a bias level (for example, a current or voltage level) associated with a deselected word line(s) of the memory core 32 for various modes of operation of the nonvolatile memory 14. As described previously, in some implementations, the nonvolatile memory 14 may operate in a lower-latency read/write mode or a lower-power read mode. Other additional or alternative modes of operation may also be supported. In one possible approach, the word line bias circuitry 30 may set a bias level in response to mode information, such as received from a memory access device, such as the processor 12. In the absence of receiving such information, the nonvolatile memory 14 may operate in a default mode of operation. For example, in at least one embodiment, the nonvolatile memory 14 may operate in a lower-latency read/write mode of operation by default. The nonvolatile memory 14 may change to, for example, a lower-power read mode of operation in response to mode information (for example, an appropriate mode indication), such as received from the processor 12, for example. If a lower-power read mode indication is received from the host processor 12, the word line bias circuitry 30 may change a bias level associated with one or more deselected word line(s) of the memory core 32 to operate in a lower-power read mode.

In another possible implementation, a lower-power read mode may comprise a default mode of operation and the word line bias circuitry 30 may change a bias level of one or more deselected word line(s) if a lower-latency read/write mode indication is received, such as from the processor 12. In one implementation, the word line bias circuitry 30 may return to a default mode of operation if a valid mode signal, for example, is not provided by the processor 12 (assuming, for example, two possible modes of operation). If three or more modes of operation are supported, a larger number of different mode signals may be used.

In at least one implementation, a value within a register, such as a single or multiple bit register, of the overlay window 28 may be set in response to mode information, such as received from the processor 12. In one possible operational scenario, for example, the processor 12 may drive the nonvolatile memory 14 to change from a default lower-latency read/write mode to a lower-power read mode. The processor 12 may initiate state information to be written to an appropriate mode register of the command interface 20 to enable the overlay window 28. The command interface 20 may write a bit (for example, a logic one) to a register of the overlay window 28 to indicate a desired mode of operation for the nonvolatile memory 14, such as, for example, a lower-power read mode. In one approach, a register of the overlay window 28 may be mapped directly or indirectly to the word line bias circuitry 30, which may proceed to change a bias level associated with one or more deselected word line(s) of the memory core 32 in accordance with a lower-power read mode. After a small delay (for example, approximately 500 nanoseconds in one implementation), the nonvolatile memory 14 may operate in a lower-power read mode.

The processor 12 may initiate (for example, instruct) a return of the nonvolatile memory 14 to a lower-latency read/write mode. For example, the command interface 20 may write a different bit (for example, a logic zero) to a register of the overlay window 28 to indicate another desired mode of operation for the nonvolatile memory 14, such as a lower-latency read/write mode, for example. In some implementations, a timer function may be implemented such that the nonvolatile memory 14 may switch back to a default mode of operation after a time period. As will be appreciated, many alternative techniques for providing mode information from the processor 12 to the nonvolatile memory 14 to set a desired mode of operation may be used. An overlay window approach is just one illustrative possibility.

In some implementations, the word line bias circuitry 30 of FIG. 1 may include a linear down regulator (LDR), an example of which will be described later in connection with FIG. 2. A LDR may be operative for lowering a voltage level of one or more deselected word line(s) of the memory core 32 by linear down regulation if a desired mode of operation of the nonvolatile memory 14 (as indicated by the processor 12) changes from one mode (for example, a lower-latency read/write mode) to another mode (for example, a lower-power read mode). In an alternative embodiment, the LDR may provide up regulation rather than down regulation. An LDR may also be operative for returning a word line voltage to a higher voltage level if a desired mode of operation identified by the processor 12 changes back. In some implementations, a LDR may have capability to support three or more possible modes of operation.

Figure 2:
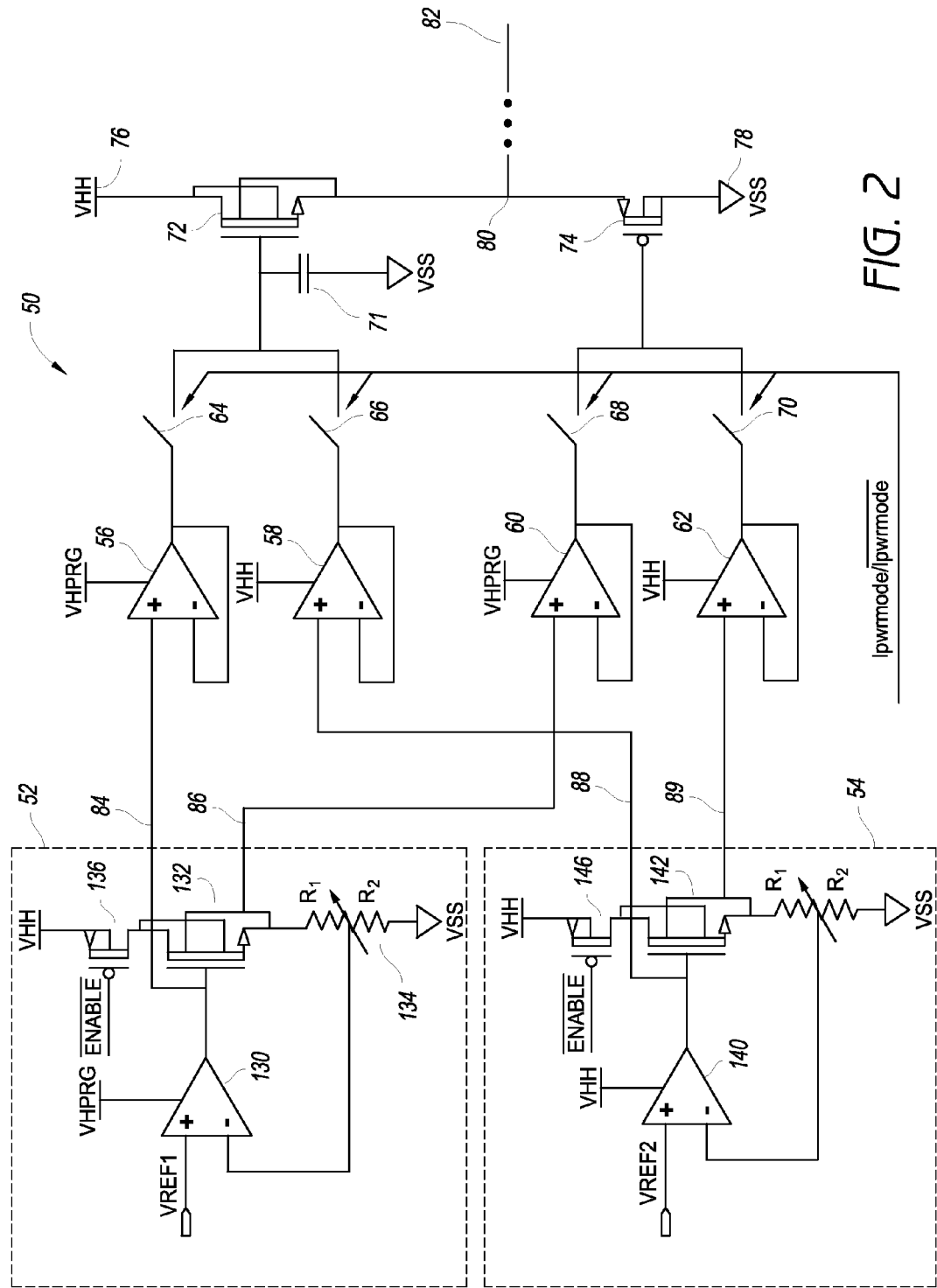
FIG. 2 is a schematic diagram illustrating a linear down regulator circuit according to an example implementation.

FIG. 2 is a schematic diagram illustrating an example of a linear down regulator (LDR) circuit 50 according to an example implementation. The LDR circuit 50 may be used, for example, as the word line bias circuitry 30 of FIG. 1 in some implementations. As illustrated in FIG. 2, the LDR circuit 50 may include: a lower-latency voltage reference circuit 52; a lower-power voltage reference circuit 54; first, second, third, and fourth buffer amplifiers 56, 58, 60, 62; first, second, third, and fourth switches 64, 66, 68, 70; an N-type insulated-gate field effect transistor (IGFET) 72; and a P-type IGFET 74. IGFETs can be MOSFETs, but gates can be made from materials other than metals, such as polysilicon, and insulators can be made of materials other than silicon oxide. In one embodiment, the N-type IGFET 72 is a triple-well type of device that is well-known in the art. The use of the triple-well configuration reduces leakage current and lowers the body effect, both of which are desirable attributes. Output nodes (for example, drain and source terminals) of the N-type IGFET 72 and the P-type IGFET 74 are connected in a line between a first power node 76 and a second power node 78 in this illustrative example. During operation, the first power node 76 may carry a first power source potential $V_{HH}$ and the second power node 78 may carry a second power source potential $V_{SS}$. For example, the first source potential $V_{HH}$ may be higher (for example, more positive) than the second source potential $V_{SS}$, although the opposite may be the case in other embodiments. The N-type IGFET 72 may be connected between the first power node 76 and an intermediate node 80. The P-type IGFET 74 may be connected between the intermediate node 80 and the second power node 78. The intermediate node 80 may be coupled to a deselected word line(s) 82 of an associated memory core.

The lower-latency voltage reference circuit 52 may generate a higher voltage signal at two output nodes 84, 86 thereof, which may be provided to input nodes of first and third buffer amplifiers 56, 60. In one possible implementation, the level of the two higher voltage output signals may be approximately equal to the desired higher voltage deselected word line voltage (for example, ~4 volts in one implementation). Likewise, the lower-power voltage reference circuit 54 may generate a lower voltage signal at two output nodes 88, 89 and provide these lower voltage signals to input nodes of the second and fourth buffer amplifiers 58, 62. The two lower voltage signals may, in some embodiments, have substantially the same voltage level as one another. In the illustrated embodiment, the level of the two lower voltage output signals may be approximately equal to the desired low voltage deselected word line voltage (for example, ~1.2 volts in one implementation). In at least one implementation, the buffer amplifiers 56, 58, 60, 62 may comprise unity gain devices and the output voltage levels of the buffers may substantially match the input voltage levels. Non-unity gain buffer amplifiers may alternatively be used. It should be appreciated that, as used herein, the phrases "high" and/or "low" or similar language, are used in a relative sense with respect to one another and are not intended to imply absolute levels.

The operation of the lower-latency voltage reference circuit 52 and the lower-power voltage reference circuit 54 will now be described. In the illustrated embodiment, the lower-latency voltage reference circuit 52 includes an operational amplifier 130, an N-type IGFET 132, a voltage divider 134, and an optional P-type IGFET 136. In one embodiment, the N-type IGFET 132 is a triple well device or is a scaled version of the N-type IGFET 72 for relatively good tracking over process, voltage, and temperature variations. In one embodiment, the voltage divider 134 is implemented by an on-chip resistance having relatively many taps, and fuses, anti-fuses, analog multiplexers, switches or the like are used to select a particular tap for the inverting input of the operational amplifier 130 during production to set a desired output voltage(s) at the output nodes 84, 86 of the lower-latency voltage reference circuit 52 or at the intermediate node 80 of the LDR circuit 50. Alternatively, laser trimming can be used to set a portion of the resistance of the voltage divider 134. In this manner, the voltage divider 134 can be considered to be variable or programmable.

In one embodiment, an integrated circuit including the lower-latency voltage reference circuit 52 also includes a bandgap voltage reference generating a reference voltage of about 2.3 volts. Of course, other voltage levels and other types of voltage references can be used. This 2.3 volt reference voltage is labeled VREF1 and is provided as an input to a non-inverting input of the operational amplifier 130. The operational amplifier 130 is powered from a voltage of a programming voltage rail VHPRG, which can be a higher voltage than a voltage of a voltage rail VHH used for powering the lower-voltage mode components.

With the P-type IGFET 136 on or enabled by having its gate being driven low, the lower-latency voltage reference circuit 52 operates as follows. An output of the operational amplifier 130 drives a gate of the N-type IGFET 132, which operates as a source follower. A voltage drop exists from the gate to the source of the N-type IGFET 132, which drives one end of the voltage divider 134 and is provided as an output at the output node 86 of the lower-latency voltage reference circuit 52. The other end of the voltage divider is grounded (VSS). A divided voltage from a tap of the voltage divider 134 is provided as an input to the inverting input of the operational amplifier 130. Due to the operation of the feedback loop, the voltages at the non-inverted input and the inverting input of the operational amplifier 130 are approximately equal. Thus, a voltage VREF1 is present at the tap of the voltage divider. Thus, if the cumulative resistance of the voltage divider 134 is R1+R2, then the voltage $V_{86}$ at the output node 86 is approximately as expressed in Eq. 1.

$$V_{86} \approx \frac{R1 + R2}{R2} \cdot VREF1 \qquad \text{Eq. 1}$$

The voltage $V_{84}$ at the output node 84 is a gate-to-source voltage drop higher than the voltage $V_{86}$ at the output node 86. When the LDR circuit 50 is in the higher-power mode, the voltage $V_{84}$ drives the gate of the N-type IGFET 72, and the voltage $V_{86}$ drives the gate of the P-type IGFET 74. There are two gate-to-source voltage drops between the gate of the N-type IGFET 72 and the gate of the P-type IGFET 74, and there is only one gate-to-source voltage drop difference in the driving voltages $V_{84}$, $V_{86}$. This difference in driving voltages advantageously provides a "dead zone," which helps to prevent mutual conduction between the N-type IGFET 72 and the P-type IGFET 74 to reduce power consumption. This "dead zone" is tolerable because due to leakage currents, it is the N-type IGFET 72 that sets and maintains the voltage at the intermediate node 80. The P-type IGFET 74 is used to speed up transitions between modes. Other techniques to reduce mutual conduction are also applicable and will be readily determined by one of ordinary skill in the art.

During production, the LDR circuit 50 can be placed in the higher-power mode, and an appropriate tap of the voltage divider 134 can be selected for closing the feedback loop of the operational amplifier 130. Alternatively, a portion of the resistance of the voltage divider can be laser trimmed. The voltage on the intermediate node 80 can be monitored while different taps of the voltage divider 134 are temporarily selected. A tap corresponding to a desirable voltage for the intermediate node 80 can then be permanently selected for field use. In one embodiment, the voltage for the intermediate node 80 is adjusted to within a range of about 2.5 volts to about 4.5 volts.

The operation of the lower-power voltage reference circuit 54 is similar to that of the lower-latency voltage reference circuit 52. In the illustrated embodiment, the topology of the voltage reference circuits 52, 54 provides voltage gain over an input voltage reference. However, in the lower-power mode, the voltage for the intermediate node 80 should be in a range of about 1.0 volts to about 1.8 volts. Thus, the 2.3 volt reference VREF1 used by the lower-latency voltage reference circuit 52 is too high. A second voltage reference VREF2 is generated from the first voltage reference VREF1 via a voltage divider. In the illustrated embodiment, the voltage of the second voltage reference VREF2 is about 1.0 volts.

The operation of the lower-power voltage reference circuit 54 will now be described. In the illustrated embodiment, the lower-power voltage reference circuit 54 includes an operational amplifier 140, an N-type IGFET 142, a voltage divider 144, and an optional P-type IGFET 146. In one embodiment, the N-type IGFET 142 is also a triple well device or is a scaled version of the N-type IGFET 72 for relatively good tracking over process, voltage, and temperature variations. The voltage divider 144 can be similar to the voltage divider 134. A particular tap of the voltage divider can be selected as an input to the inverting input of the operational amplifier 140 during production to set a desired output voltage(s) at the output nodes 88, 89 of the lower-power voltage reference circuit 54 or at the intermediate node 80 of the LDR circuit 50.

During production, the LDR circuit 50 can be placed in the lower-power mode, and an appropriate tap of the voltage divider 144 can be selected for closing the feedback loop of the operational amplifier 140. Alternatively, a portion of the resistance of the voltage divider can be laser trimmed. The voltage on the intermediate node 80 can be monitored while different taps of the voltage divider 144 are temporarily selected. A tap corresponding to a desirable voltage for the intermediate node 80 can then be permanently selected for field use. In one embodiment, the voltage for the intermediate node 80 is adjusted to within a range of about 1.0 volts to about 1.8 volts.

As described earlier, the N-type IGFET 72 sets the voltage at the intermediate node 80. To save power, portions of the LDR circuit 50 can be disabled. For example, an appropriate gate voltage for the N-type IGFET 72 can be stored on a capacitor 71. The capacitor 71 represents a capacitance that is more than a mere parasitic capacitance. After appropriate gate drive levels are established, the switches 64, 66, 68, 70 can be opened and the N-type IGFET 72 should maintain an appropriate voltage level for the intermediate node 80. An added capacitance for the P-type IGFET 74 is not needed as in the illustrated embodiment, the P-type IGFET 74 is used only for transitions and should be relatively non-conducting in steady-state operation. Of course, other components, such as a pull-up resistance for the gate of the P-type IGFET 74 can be used to ensure that the P-type IGFET 74 is not leaking current during normal operation, that is, in periods other than transitions. In addition, the P-type IGFETs 136, 146 can be disabled by bringing their gate voltages high such that the signal ENABLE is high. This prevents current from flowing through, for example, the voltage dividers 134, 144. Additionally, the ENABLE signals can be independently controlled such that, for example, the P-type IGFET 136 is not enabled when the lower-power mode is being set, and the P-type IGFET 146 is not enabled when the higher-power mode is being set.

In one embodiment, slew rates are also controlled. The various word lines 82 coupled to the intermediate node 80 can include a substantial amount of parasitic capacitance. The rapid changing of voltage on the intermediate node 80 can then result in a relatively large current spike on the VHH and/or VSS supplies, which could be damaging to traces, metallization lines, bond wires, or the like and can be disruptive to other circuits. In one embodiment, slew rate control is built into the buffer amplifiers 56, 58, 60, 62 such that voltages on the intermediate node 80 are relatively gradually changed. A slew rate control can be implemented by, for example, a low-pass filter.

A wide variety of variations to the lower-latency voltage reference circuit 52 and the lower-power voltage reference circuit 54 exist. For example, in one alternative, depending on the availability of suitable voltage references, one or more voltage dividers can be used to generate appropriate voltage levels for one or more of the outputs of the lower-latency voltage reference circuit 52 and/or lower-power voltage reference circuit 54. In an alternative embodiment, rather than switching between reference voltages using the switches 64, 66, 68, 70, having two pairs of buffer amplifiers 56, 58, 60, 62, and having two substantially similar voltage reference circuits 52, 54, only one of the voltage reference circuits 52, 54 is present and the reference voltage applied to an input of the operational amplifier 130 or the operational amplifier 140 is switched to vary the voltage at the intermediate node 80.

First, second, third, and fourth switches 64, 66, 68, 70, are operative for appropriately providing control signals to the gate nodes of the N-type IGFET 72 and the P-type IGFET 74. As will be described in greater detail, in the illustrated implementation, first and third switches 64, 68 may open and close together, and the second and fourth switches 66, 70 may open and close together. The switches 64, 66, 68, 70 may be controlled, for example, in response to mode information, such as received from a processor. For example, in one approach, the switches 64, 66, 68, 70 may be controlled based at least in part on a state of a bit (for example, a state of an lpwrmode signal) stored within a register of the overlay window 28. If the lpwrmode signal is set at logic zero, a memory device may, for example, operate in a lower-latency read/write mode. In such a case, the first and third switches 64, 68 may close and the second and fourth switches 66, 70 may open, thus providing higher voltage level control signals (from the lower-latency voltage reference circuit 52) to the gate nodes of the N-type IGFET 72 and the P-type IGFET 74. The lower-power voltage reference circuit 54 and the second and fourth buffer amplifiers 58, 62 may be disabled to conserve energy. Higher voltage level control signals provided to the gate nodes of the N-type IGFET 72 and the P-type IGFET 74 may result in a higher voltage of one or more deselected word line(s) 82 of a memory core (for example, ~2.5-4.5 volts in one at least implementation) during the lower-latency read/write mode.

If the lpwrmode signal in the overlay window 28 is subsequently changed, such as to logic one in response to (for example, based at least in part on) mode information, received from a processor, for example, a memory device may change to a lower-power read mode of operation. If this occurs, the first switch 64 and the third switch 68 may open, thus removing high voltage level control signals from gate nodes of the N-type IGFET 72 and the P-type IGFET 74. The second and fourth switches 66, 70, on the other hand, may close, thereby providing lower voltage control signals at output nodes of the second and fourth buffers 58, 62 (for example, ~1.2 volts) to gate nodes of the N-type IGFET 72 and the P-type IGFET 74. As will be described in greater detail, this may result in a lower voltage of one or more deselected word line(s) 82 of a memory core (for example, ~1.0-1.8 volts in at least one implementation) during a lower-power read mode. The lower-latency voltage reference circuit 52 and the first and third buffer amplifiers 56, 60 may be disabled during a lower-power read mode of operation. It should be appreciated that arrangement and/or operation of the first, second, third, and fourth switches 64, 66, 68, 70 in FIG. 2 represents one illustrative technique for providing control signals to gate nodes of the N-type IGFET 72 and the P-type IGFET 74. Other techniques and/or other providing arrangements may alternatively be used.

If a lower-power read mode is initiated, a lower voltage control signal (for example, ~1.2 volts) provided by the second and fourth buffer amplifiers 58, 62 may place a large $V_{gs}$ bias across the P-type IGFET 74. A deselected word line voltage may still be high (for example, ~4 volts) and the P-type IGFET 74 as a result may pull word line voltage down to about ~1.2 volts plus a threshold voltage of the P-type IGFET 74. The P-type IGFET 74 may be selected to provide a suitable amount of displacement current from one or more deselected word line(s) to ground. After the P-type IGFET 74 has pulled a deselected word line voltage down, both the N-type IGFET 72 and the P-type IGFET 74 may begin to turn off. Leakage current may pull a word line down to a state to satisfy a transconductance of the N-type IGFET 72. It should be appreciated that illustrated circuit architecture of the LDR circuit 50, shown in FIG. 2, may comprise one possible example of an LDR circuit that may be used. Other architectures may alternatively be used.

Figure 3:
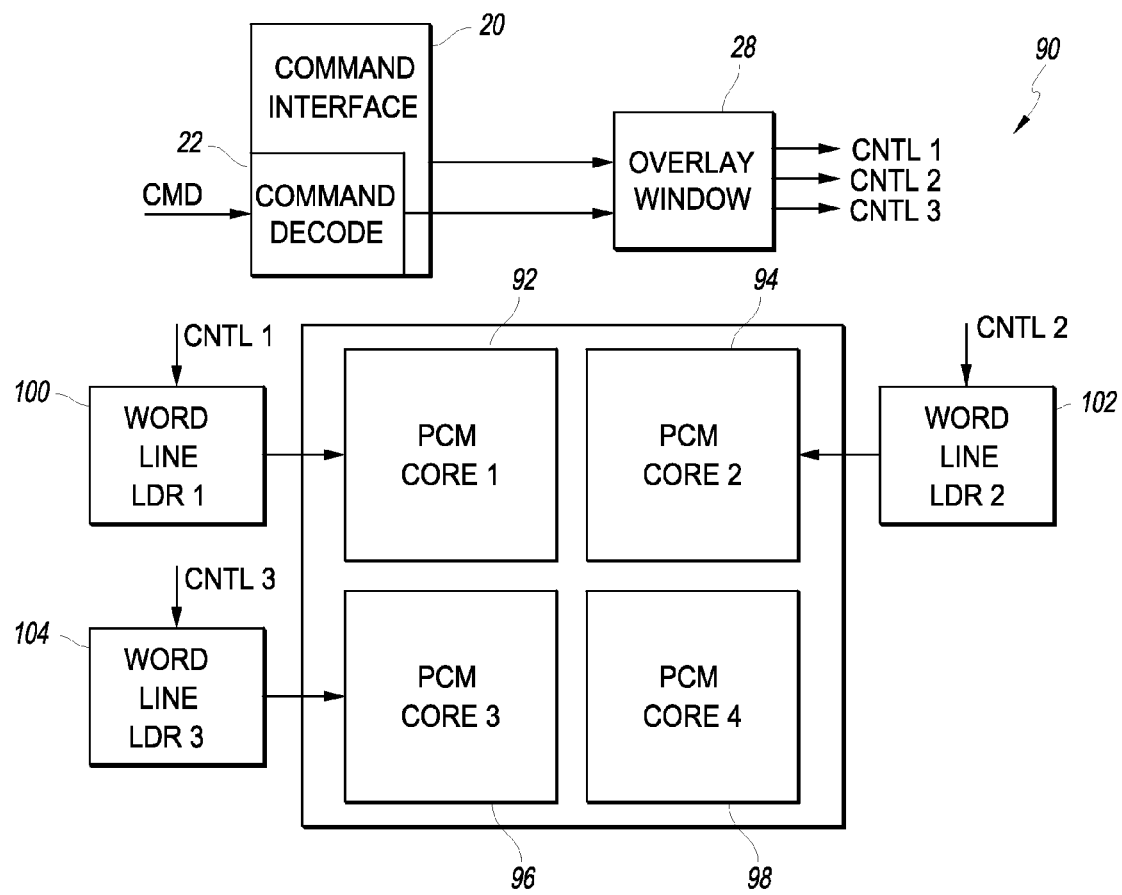
FIG. 3 is a block diagram illustrating a multiple-core nonvolatile memory apparatus according to an example implementation.

FIG. 3 is a block diagram illustrating an example multiple-core nonvolatile memory apparatus 90 according to an example implementation. In one possible application, the multiple-core nonvolatile memory apparatus 90 may be used in place of, or in addition to, the nonvolatile memory 14 of FIG. 1 to provide information storage and/or retrieval functions for the processor 12. Other applications also exist. As illustrated, the multiple-core nonvolatile memory apparatus 90 may include: a command interface 20 having command decode functionality 22, an overlay window 28, a number of phase change memory (PCM) cores 92, 94, 96, 98, and a number of LDR circuits 100, 102, 104. Although not shown, the multiple-core nonvolatile memory apparatus 90 may also include address and input/output registers as, for example described previously in connection with FIG. 1. In one possible implementation, the PCM cores 92, 94, 96, 98 may be arranged into a bank and may or may not be included in a common interoperable platform-type structure (for example, chip, substrate, or board), such as with the processor 12. Although illustrated as PCM memory cores, it should be appreciated that other memory technologies, or combinations of different technologies, may be utilized in other implementations. In the illustrated implementation, there are four memory cores 92, 94, 96, 98 associated with the multiple-core nonvolatile memory apparatus 90. It should be appreciated that any number of cores (two or more) may be used in the multiple-core nonvolatile memory apparatus 90 and, for example, in some instances, hundreds or even thousands of cores may be utilized.

The command interface 20, the command decode functionality 22, and the overlay window 28 of FIG. 3 perform substantially the same operations described earlier in connection with FIG. 1. However, operations may be performed for multiple memory cores in this example. As shown in FIG. 3, the first, second, and third PCM cores 92, 94, 96 within the multiple-core nonvolatile memory apparatus 90 have corresponding LDR circuits 100, 102, 104. The LDR circuits 100, 102, 104 provide a similar operations to the LDR circuit 50, described previously. In one possible operational scenario, a processor coupled to the multiple-core nonvolatile memory apparatus 90 may provide mode information to the apparatus 90 to set modes of the PCM cores 92, 94, 96. In at least one possible implementation, a processor may be permitted by the memory apparatus 90 to specify a different mode of operation for a core, such as the cores 92, 94, 96 that have corresponding LDR circuits 100, 102, 104 (or some other form of dynamically settable word line bias circuitry). That is, in an implementation, the LDR circuits 100, 102, 104 may operate independently of one another. In one approach, one or more bit registers within the overlay window 28 may be assigned respective LDR circuits 100, 102, 104 to identify a present desired mode of operation for a corresponding memory core 92, 94, 96. Other techniques for providing mode information, for example, from a processor, may alternatively be used.

As illustrated in FIG. 3, in various implementations, some of memory cores within the multiple-core nonvolatile memory apparatus 90 may have corresponding LDR circuitry. That is, some cores (for example, PCM core 98 in FIG. 3) may operate without corresponding dynamically settable word line bias circuitry. In an implementation, mode of operation of some cores may not, therefore, be set by a processor. Some memory cores may, for example, be capable of operating in a single mode of operation (for example, a lower-latency read/write mode). Other cores may operate in a lower-power read mode much of the time, but may change to a lower-latency read/write mode so as to be written to. Many other variations may be implemented.

In some embodiments, a multiple-core memory apparatus may be provided that utilizes multiple memory structures, with structures including multiple memory cores. Some or all of cores of a structure may have corresponding dynamically settable word line bias circuitry, for example. Thus, a coupled processor may be able to set mode of operation for applicable cores. In one approach, a processor may be able to set a mode of operation of memory cores in a multi-structure system on a core-by-core basis by providing respective mode information to a memory for one or more cores having distinctly corresponding word line bias circuitry. In another possible approach, a processor may be able to set mode of operation of memory cores in a multi-structure system on a structure-by-structure basis. That is, a processor may identify a mode of operation for a structure and corresponding memory cores may operate in an identified mode. A structure may have word line bias circuitry to set a bias level for memory cores of the structure, or sub-groups of cores of a structure may also share word line bias circuitry. In at least one embodiment, for example, two or more cores of a structure may be coupled to corresponding word line bias circuitry to set a bias level associated with one or more deselected word lines of two or more cores.

In some multi-core, multi-structure embodiments, memory cores of one or more of the memory structures may have no LDR circuitry, for example. Thus, a processor may not be able to set mode of operation of applicable cores, but claimed subject matter is not limited in scope to this illustrative example. For example, in one possible implementation, cores of a particular structure that does not have LDR circuitry may operate in a lower-latency read/write mode. A processor for applications may use a structure where, for example: (1) lower-latency operation may be desired and/or (2) multiple short random write operations may typically be interspersed with read operations. Another structure in an apparatus may, for example, have applicable cores operating in a lower-power read mode. A structure may be used by a processor for, for example, read intensive applications. As described previously, if LDR or other dynamically settable word line bias circuitry is provided for a memory core, a core may nonetheless have a default mode of operation to be used in the absence of receiving mode information from a processor. In at least one implementation, different structures of a multiple-structure memory apparatus may use different default modes of operation for memory cores equipped with LDR circuitry. In a multiple-structure memory apparatus implementation, any number of memory cores (for example, one or more) may be provided for a structure and any number of structures (for example, two or more) may be used. In some multiple-structure implementations, a thousand or more memory structures may be provided, different structures including a thousand or more memory cores.

Figure 4:
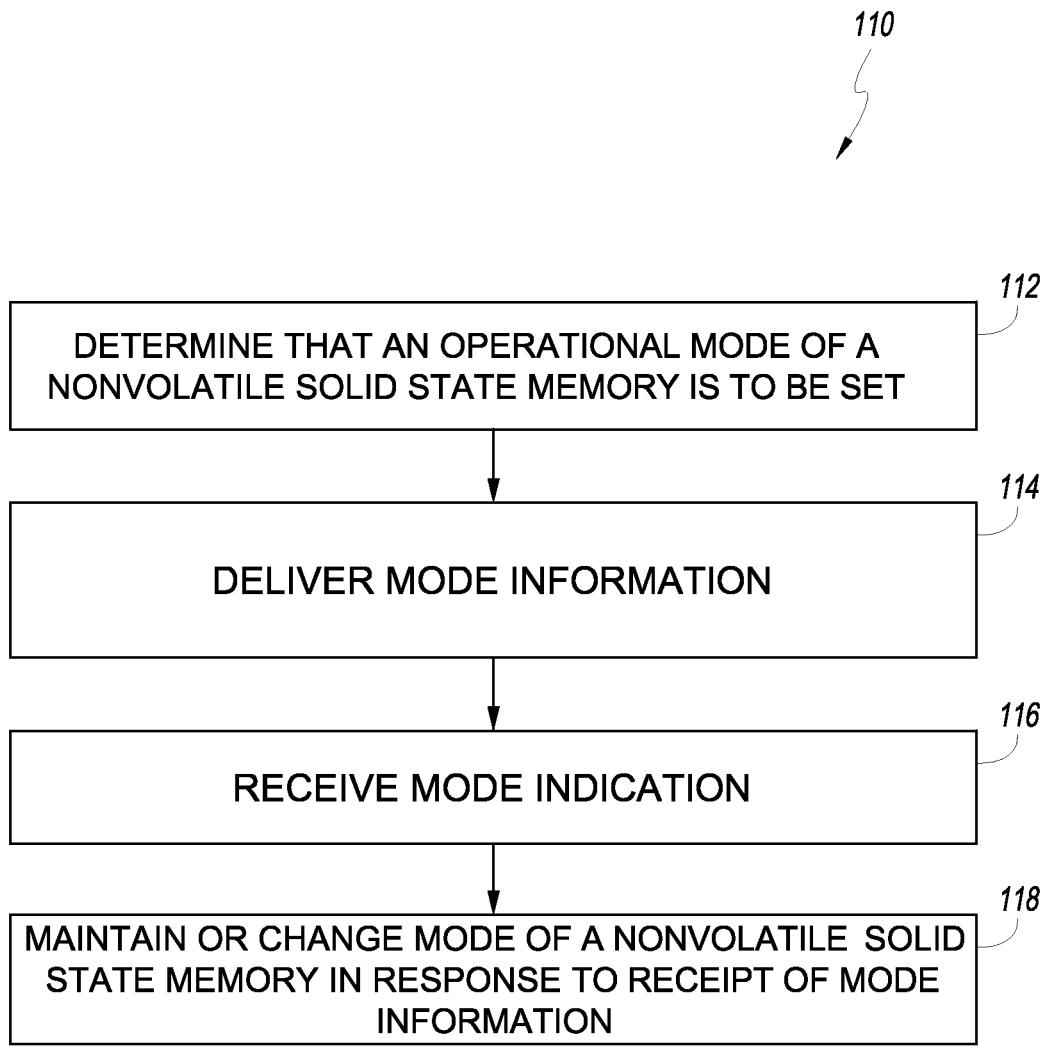
FIG. 4 is a flowchart illustrating a method for operating a computing system according to an example implementation.

FIG. 4 is a flowchart illustrating a method 110 for operating an apparatus, such as a computing system, according to an example implementation. The order of blocks, such as the blocks 112-118, comprises an example order. Claimed subject matter is not limited in scope to illustrative or example embodiments. It will be appreciated by the skilled practitioner that the illustrated method can be modified in a variety of ways. For example, in another embodiment, various portions of the illustrated method can be combined, can be rearranged in an alternate sequence, can be removed, or the like. Therefore, embodiments in accordance with claimed subject matter may include all of, less than, or more than the blocks 112-118. A method, such as the method 110, may be performed as a single method or as multiple methods. A decision may be made to set an operational mode of a memory device, such as illustrated by, for example, the block 112. The decision may be made by, for example, a processor or other memory access device coupled to the nonvolatile memory. In one possible approach, the decision may be made based, at least in part, on a performance criterion such as, for example, power consumption. For example, a processor may decide to maintain a mode of a nonvolatile memory or change a mode from a lower-latency read/write mode to a lower-power read mode if a high level of read activity for the nonvolatile memory is expected in the near future, for example.

If a decision to change mode has been made, for example, mode information may be provided to a memory device, for example, to identify a desired mode change, such as illustrated by, for example, the block 114. If a decision is made by a processor, for example, the mode information may be provided by a direct transfer from a processor, a transfer through an intermediary circuit or device, or a delivery from another circuit or device to a memory, such as at least partially under control of a processor. Mode information may be as simple as a single bit signaling that a mode is to be maintained or to be changed. For example, for a memory core capable of operating in two different modes of operation, a logic one may indicate that the mode is to be changed and a logic zero may indicate that the current mode is to be maintained. Alternatively, a logic zero may indicate that a first mode is to be used and a logic one may indicate that a second mode is to be used. More complex mode signaling schemes may also be used in some implementations. For example, multiple bits may be used if a memory is capable of operating in more than two different modes of operation. Multiple bits may also be used in some implementations if more than one memory core within a nonvolatile memory has a changeable mode (for example, more than one memory core has associated LDR circuitry). Other forms of mode information may alternatively be used and claimed subject matter is not limited in this regard.

Another method embodiment may comprise the blocks 116, 118. For example, a memory device may perform operations, such as those illustrated, for example. Mode information may be received by a memory device from a memory access device external to the memory device (for example, a processor) as illustrated by, for example, the block 116. Receipt of the mode information may encompass receipt directly or indirectly from an external memory access device (for example, receipt from another device under full or partial control of the external memory access device). In response to received mode information, mode of operation of the nonvolatile memory may be maintained or changed, such as illustrated by, for example, block 118. For example, in at least one embodiment, a deselected word line voltage of a memory core or of multiple memory cores of a memory device may be maintained or changed in response to mode information. In one possible scenario, for example, mode information may indicate a change in mode from a lower-latency read/write mode to a lower-power read mode. In response, a nonvolatile memory may, for example, reduce a deselected word line voltage of a memory core. A deselected word line voltage may be reduced using, for example, linear down regulation. In one possible approach, received mode information may affect one or more bit registers of an overlay window to activate LDR circuitry. In at least one implementation, the LDR circuit 50 of FIG. 2 or similar circuitry may be used to reduce a deselected word line voltage of a memory device.

Apparatus, such as those in the form of memory devices, in accordance with claimed subject matter herein may, for example, be used in any number of different applications. Memory devices may be incorporated into other apparatus, for example, computers, computer peripherals, personal digital assistants, cameras, telephones, cell phones or other wireless devices, displays, chipsets, set top boxes, video games, vehicles, satellite communicators, internet servers, routers, base stations, network access devices, audio-video devices, or any combination thereof. In one possible application, memory devices in accordance with claimed subject matter may be used in one or more apparatus in the form of data centers. Memory capacity used by data centers appears to be large and growing. Memory structures or techniques in accordance with claimed subject matter may lower energy costs and/or cooling costs in data centers, for example.

Methodologies in accordance with claimed subject matter may be implemented by various techniques depending, at least in part, on applications according to particular features or examples. For example, methodologies may be implemented in hardware, firmware, or combinations thereof, along with software. In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, or other devices or units designed to perform functions such as those described herein, or combinations thereof.

As used herein, the word "connected" means a direct or indirect conductive connection between elements, the word "coupled" means that elements are able to communicate with one another but are not necessarily directly conductively connected (although the word also encompasses a conductive connection), and the phrase "connected in a line" means that nodes are interconnected in a line between two nodes, but are not necessarily connected as a series circuit (for example, all of the nodes in the line do not necessarily have the same current flowing through them during circuit operation). Two nodes that are "connected in a line" are not necessarily directly conductively connected to one another; that is, there may be one or more other elements between the two nodes in the line. The phrase "connected in a line" does encompass two nodes that are directly or indirectly conductively connected to one another in a line and also encompasses two nodes that are connected in series. The word "coupled," as used herein, encompasses a situation where two nodes have one or more other nodes between them as long as there is electrical communication between the two nodes. The word "coupled" also encompasses a situation where two nodes can communicate through inductive, capacitive, or radio coupling.

In the preceding detailed description, numerous specific details have been set forth to provide a thorough understanding of claimed subject matter. However, it will be understood by those skilled in the art that claimed subject matter may be practiced without these specific details. In other instances, methods or apparatus that would be known by one of ordinary skill have not been described in detail so as not to obscure claimed subject matter.

Some portions of the preceding detailed description have been presented in terms of logic, algorithms, or symbolic representations of operations on binary states stored within a memory of a specific apparatus (for example, a special purpose computing device or platform). In the context of this particular specification, the term specific apparatus or the like includes a general purpose computer once it may be programmed to perform particular functions pursuant to instructions from program software. Algorithmic descriptions or symbolic representations are examples of techniques used by those of ordinary skill in the signal processing or related arts to convey the substance of their work to others skilled in the art. An algorithm may be here, and generally, may be considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated as electronic signals representing information. It has proven convenient at times, principally for reasons of common usage, to refer to such signals as bits, data, values, elements, symbols, characters, terms, numbers, numerals, information, or the like. It should be understood, however, that all of these or similar terms are to be associated with appropriate physical quantities and are merely convenient labels. Unless specifically stated otherwise, as apparent from the following discussion, it may be appreciated that throughout this specification discussions utilizing terms such as "processing," "computing," "calculating," "determining", "establishing", "obtaining", "identifying", "selecting", "generating", or the like may refer to actions or processes of a specific apparatus, such as a special purpose computer or a similar special purpose electronic computing device. In the context of this specification, therefore, a special purpose computer or a similar special purpose electronic computing device may be capable of manipulating or transforming signals, typically represented as physical electronic or magnetic quantities within memory devices, registers, or other information storage devices, transmission devices, or display devices of the special purpose computer or similar special purpose electronic computing device. In the context of this particular patent application, the term "specific apparatus" may include a general purpose computer once it may be programmed to perform particular functions pursuant to instructions from program software.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and storage of charge or a release of stored charge. Likewise, in other memory devices, a change of state may comprise a physical change or transformation in magnetic orientation or a physical change or transformation in molecular structure, such as from crystalline to amorphous or vice-versa. In still other memory devices, a change in physical state may involve quantum mechanical phenomena, such as, superposition, entanglement, or the like, which may involve quantum bits (qubits), for example. The foregoing may be not intended to be an exhaustive list of all examples in which a change in state for a binary one to a binary zero or vice-versa in a memory device may comprise a transformation, such as a physical transformation. Rather, the foregoing are intended as illustrative examples.

One embodiment includes an apparatus, the apparatus including: a memory core having memory cells operatively accessible via access lines, the memory core being capable of operating in multiple modes of operation including at least a lower power read mode and a lower latency read/write mode, wherein the lower power read mode has lower power consumption than the lower latency read/write mode; and access line bias circuitry configured to set a bias level associated with a deselected access line of the memory core, wherein the bias level is set in response to mode information.

One embodiment includes an apparatus, wherein the apparatus includes: a plurality of memory cores having at least a first memory core and a second memory core; first access line bias circuitry coupled to the first memory core configured to provide a bias level associated with a deselected access line of the first memory core; and second access line bias circuitry coupled to the second memory core configured to provide a bias level associated with a deselected access line of the second memory core; wherein the first and second access line bias circuitry configured to operate independently of one another so that the bias level associated with the deselected access line of the first memory core is capable of being different from the bias level associated with the deselected access line of the second memory core.

One embodiment includes an apparatus, the apparatus including: a memory access device to read information from and write information to a memory device, the memory access device being capable of dynamically setting a mode of operation of a memory core of the memory device to manage power consumption of the memory.

One embodiment includes a machine-implemented method, the method including: receiving mode information from a memory access device at a memory device; and lowering a deselected access line voltage of a memory core of the memory device if the mode information indicates a mode change for the memory core from a lower latency read/write mode of operation to a lower power read mode of operation.

While there has been illustrated or described what are presently considered to be example features, it will be understood by those skilled in the art that various other modifications may be made, or equivalents may be substituted, without departing from claimed subject matter. Additionally, many modifications may be made to adapt a particular situation to teachings of claimed subject matter without departing from central concept(s) described herein.

Therefore, it may be intended that claimed subject matter not be limited to particular examples disclosed, but that such claimed subject matter may also include all aspects falling within the scope of appended claims, or equivalents thereof.

We claim:

1. An apparatus comprising:
a first operational amplifier having a non-inverting input, an inverting input, and an output, wherein the non-inverting input is configured to receive a first reference voltage;
a first N-type insulated-gate field effect transistor (IGFET) having a gate, a drain, and a source, wherein the gate of the first N-type IGFET is coupled to the output of the first operational amplifier;
a first voltage divider having a first end, a second end, and at least one tap, wherein the first end is coupled to the source of the first N-type IGFET and the at least one tap is coupled to the inverting input of the first operational amplifier;
a first buffer amplifier having an input and an output, wherein the input is coupled to the gate of the first N-type IGFET;
a second buffer amplifier having an input and an output, wherein the input is coupled to the source of the first N-type IGFET;
a second N-type IGFET having a gate, a drain, and a source, wherein the gate of the second N-type IGFET is operatively coupled to the output of the first buffer amplifier in a first mode; and
a P-type IGFET having a gate, a drain, and a source, wherein the gate of the P-type IGFET is operatively coupled to the output of the second buffer amplifier in the first mode, wherein the source of the P-type IGFET is coupled to the source of the second N-type IGFET and to an output node, wherein the output node is configured to provide a bias for a memory access line.

2. The apparatus of claim 1, further comprising a capacitor having an end coupled to the gate of the second N-type IGFET.

3. The apparatus of claim 1, wherein the voltage divider comprises a plurality of taps of different voltage levels, wherein the at least one tap is selected from the plurality of taps during production.

4. The apparatus of claim 1, wherein at least one resistor of the voltage divider is laser trimmed during production.

5. The apparatus of claim 1, further comprising an enable switch coupled to a drain of the first N-type IGFET.

6. The apparatus of claim 1, further comprising:
a second operational amplifier having a non-inverting input, an inverting input, and an output, wherein the non-inverting input is configured to receive a second reference voltage;

a third N-type IGFET having a gate, a drain, and a source, wherein the gate of the third N-type IGFET is coupled to the output of the second operational amplifier;

a second voltage divider having a first end, a second end, and at least one tap, wherein the first end is coupled to the source of the third N-type IGFET and the at least one tap is coupled to the inverting input of the second operational amplifier;

a third buffer amplifier having an input and an output, wherein the input is coupled to the gate of the third N-type IGFET; and a fourth buffer amplifier having an input and an output, wherein the input is coupled to the source of the third N-type IGFET;

wherein the gate of the second N-type IGFET is operatively coupled to the output of the third buffer amplifier in a second mode;

wherein the gate of the P-type IGFET is operatively coupled to the output of the fourth buffer amplifier in the second mode.

7. The apparatus of claim 6, further comprising:

for the first mode, closing a first switch and a second switch and opening a third switch and a fourth switch; and for the second mode, opening the first switch and the second switch and closing the third switch and the fourth switch;

wherein the first switch is disposed in a signal path between an output of a first buffer amplifier that generates the first buffered voltage and the gate of the second N-type IGFET;

wherein the second switch is disposed in a signal path between an output of a second buffer amplifier that generates the second buffered voltage and the gate of the P-type IGFET;

wherein the third switch is disposed in a signal path between an output of a third buffer amplifier that generates the third buffered voltage and the gate of the second N-type IGFET; and wherein the fourth switch is disposed in a signal path between an output of a fourth buffer amplifier that generates the fourth buffered voltage and the gate of the P-type IGFET.

8. The apparatus of claim 6, further comprising:

a first switch disposed in a signal path between the output of the first buffer amplifier and the gate of the second N-type IGFET;

a second switch disposed in a signal path between the output of the second buffer amplifier and the gate of the P-type IGFET;

a third switch disposed in a signal path between the output of the third buffer amplifier and the gate of the second N-type IGFET; and a fourth switch disposed in a signal path between the output of the fourth buffer amplifier and the gate of the P-type IGFET.

9. A method of generating a bias for a memory access line at an output node, the method comprising:

receiving a first reference voltage at a non-inverting input of a first operational amplifier;

biasing a gate of a first N-type insulated-gate field effect transistor (IGFET) via an output of the first operational amplifier;

generating a first divided voltage by dividing a source voltage of the first N-type IGFET, and providing the first divided voltage to an inverting input of the first operational amplifier;

buffering a gate voltage of the first N-type IGFET to generate a first buffered voltage;

buffering a source voltage of the first N-type IGFET to generate a second buffered voltage;

in a first mode, source following the first buffered voltage with a second N-type IGFET, wherein a source of the second N-type IGFET is operatively coupled to an output node; and in the first mode, source following the second buffered voltage with a P-type IGFET, wherein the source of the P-type IGFET is also coupled to the output node.

10. The method of claim 9, further comprising storing a voltage of a gate of the second N-type IGFET with a capacitor.

11. The method of claim 9, further comprising selecting the first divided voltage by selecting a tap from a plurality of taps of a voltage divider.

12. The method of claim 9, further comprising laser trimming at least one resistor of a voltage divider during production, wherein the voltage divider generates the first divided voltage.

13. The method of claim 9, further controlling enabling and disabling of the first N-type IGFET via an enable switch coupled to a drain of the first N-type IGFET.

14. The method of claim 9, further comprising:

receiving a second reference voltage at a non-inverting input of a second operational amplifier;

biasing a gate of a third N-type IGFET via an output of the second operational amplifier;

generating a second divided voltage by dividing a source voltage of the third N-type IGFET, and providing the second divided voltage to an inverting input of the second operational amplifier;

buffering a gate voltage of the third N-type IGFET to generate a third buffered voltage; and buffering a source voltage of the third N-type IGFET to generate a fourth buffered voltage;

in a second mode, source following the third buffered voltage with the second N-type IGFET;

in the second mode, source following the fourth buffered voltage with the P-type IGFET.

\* \* \* \* \*